United States Patent
Farrahi et al.

(10) Patent No.: US 7,370,305 B2
(45) Date of Patent: May 6, 2008

(54) METHOD AND APPARATUS FOR FACILITATING CELL PLACEMENT FOR AN INTEGRATED CIRCUIT DESIGN

(75) Inventors: Amir H. Farrahi, San Jose, CA (US); Anurag Bhatnagar, Sunnyvale, CA (US); Nabanjan Das, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 262 days.

(21) Appl. No.: 11/350,667

(22) Filed: Feb. 8, 2006

(65) Prior Publication Data

US 2007/0186200 A1    Aug. 9, 2007

(51) Int. Cl.
*G06F 17/50* (2006.01)

(52) U.S. Cl. ............................................ 716/9; 716/10

(58) Field of Classification Search ................ 716/8–11
See application file for complete search history.

(56) References Cited

U.S. PATENT DOCUMENTS

| | | | | |
|---|---|---|---|---|
| 5,801,959 A | * | 9/1998 | Ding et al. | 716/11 |
| 6,085,032 A | * | 7/2000 | Scepanovic et al. | 716/10 |
| 6,182,272 B1 | * | 1/2001 | Andreev et al. | 716/13 |
| 6,976,238 B1 | * | 12/2005 | Teig et al. | 716/14 |

* cited by examiner

*Primary Examiner*—Thuan Do
*Assistant Examiner*—Binh Tat
(74) *Attorney, Agent, or Firm*—Park, Vaughan & Fleming LLP

(57) ABSTRACT

One embodiment of the present invention provides a system that determines a feasible cell placement for an integrated circuit design. During operation, the system receives an input cell placement, which is typically determined using a quadratic placement technique. Next, the system receives a set of regions within the integrated circuit design. Each region has a capacity constraint which specifies an upper limit on the total cell area that can be placed within the region. The system then generates a bi-partite graph which comprises instance vertices, region vertices, and edges. An instance vertex is associated with a cell instance, a region vertex is associated with a region, and each edge is incident on an instance vertex and a region vertex. Each edge is assigned a cost that indicates the cost of placing the associated cell instance in the associated region. Next, the system associates edges with shadow edges. Note that an edge and an associated shadow edge are incident to the same instance vertex. The system then ranks the edges using the costs of the shadow edges. Next, the system selects a set of edges using the edge rankings. Finally, the system determines the feasible cell placement using the set of edges.

18 Claims, 2 Drawing Sheets

METHOD AND APPARATUS FOR FACILITATING CELL PLACEMENT FOR AN INTEGRATED CIRCUIT DESIGN

BACKGROUND

1. Field of the Invention

This invention relates to integrated circuit design. More specifically, the invention relates to a method and apparatus for facilitating cell placement for an integrated circuit design.

2. Related Art

Cell placement is an important step in electronic design automation. During cell placement, cells are assigned physical locations within an IC (Integrated Circuit) design. A cell placement of an inferior quality is likely not only to affect the chip's performance, but it can also make it impossible to manufacture the chip by generating excessive wirelengths, which are beyond available routing resources. Consequently, a cell placement technique must perform the assignment while optimizing a number of objectives to ensure that an integrated circuit design meets its performance demands. A typical cell placement objective is to minimize the total wirelength (which is defined as the sum of the lengths of all the wires in the design) without violating the routing resource constraints.

Top-down partitioning-based cell placement is one of the popular approaches used for cell placement. This technique typically works by recursively dividing each partition into several sub-partitions, and at the same time dividing the contents of each partition into those sub-partitions. In addition, at each partitioning level, a pin-propagation step is performed to de-couple the dependencies of the various sub-partitions on the partitioning of the other sub-partitions as the partitioning goes deeper and deeper. An in-depth treatment of partitioning and partitioning-based placement techniques can be found in N. Sherwani, "*Algorithms for VLSI Physical Design Automation,*" $3^{rd}$ Edition, Kluwer Academic Press, 1999.

Quadratic placement is one of the effective techniques for doing top-down partitioning-based placement. One of the basic ideas behind quadratic placement is that as interconnects become increasingly more important in defining the performance of the highly integrated circuits (due to scaling), long interconnects are likely to be more problematic, and on the timing critical paths. To alleviate this problem, and to penalize long wires, a quadratic formulation seeks to minimize the sum of the quadratic wire-lengths. In other words, in a quadratic formulation, one tries to find a place for all the movable objects such that the summation of the quadratic rectilinear distance of all the connected pairs of objects is minimized.

If there are no fixed boundary connections connecting the movable objects to the outside, the obvious solution to the quadratic formulation would be to place all the movable objects on top of one another, which is obviously not a feasible solution. The external connections act as a factor to distribute the movable objects across the chip.

Unfortunately, the solution from the quadratic solver can be infeasible because it does not meet the capacity constraints in various sections of the chip. Typically, the concentration of objects in some areas of the chip is extremely high, while the concentration of objects in other areas is extremely low.

Prior art techniques to remedy this problem have a number of drawbacks. These techniques are typically not very efficient, and hence they can take an enormous amount of time to determine a feasible cell placement. Additionally, prior art techniques are also very complicated, and hence are very difficult to implement, debug, and maintain.

Hence, what is needed is a method and an apparatus for determining a feasible cell placement which is computationally efficient and which is easy to implement, debug, and maintain.

SUMMARY

One embodiment of the present invention provides a system that determines a feasible cell placement for an integrated circuit design. During operation, the system receives an input cell placement, which assigns a position to each cell instance in the integrated circuit design. Typically, the input cell placement is determined using a quadratic placement technique. Note that the input cell placement is usually an infeasible cell placement that violates the capacity constraint of a region. Next, the system receives a set of regions within the integrated circuit design. The set of regions can include two rectangular regions, or four rectangular regions (or quadrants). Each region has a capacity constraint which can specify an upper limit on the total cell area that can be placed within the region. The system then generates a bipartite graph which comprises instance vertices, region vertices, and edges. An instance vertex is associated with a cell instance, a region vertex is associated with a region, and each edge is incident on an instance vertex and a region vertex. Each edge is assigned a cost that indicates the cost of placing the associated cell instance in the associated region. Next, the system associates edges with shadow edges. Note that an edge and an associated shadow edge are incident to the same instance vertex. The system then ranks the edges using the costs of the shadow edges. Next, the system selects a set of edges using the edge rankings. Finally, the system determines the feasible cell placement using the set of edges. Note that the feasible cell placement is a cell placement that satisfies the capacity constraints of all regions.

In a variation on this embodiment, an edge which is incident on an instance vertex is considered to be alive if the cell instance associated with the instance vertex has not been assigned to a region. A shadow edge associated with the edge is the next cheapest live edge incident on the instance vertex.

In a variation on this embodiment, an anchor edge associated with vertex v is the costliest shadow edge out of all the shadow edges associated with the live edges which are incident on instance vertex v. Further, the system ranks the edges by assigning a rank r(e) to edge e using the expression $r(e)=cost_{anchor}(v)+[cost(e)-cost_S(e)]$, where cost(e) is the cost of the edge e, $cost_S(e)$ is the cost of the shadow edge associated with the edge e, and $cost_{anchor}(v)$ is the cost of the anchor edge associated with the instance vertex v. Note that the edge e is incident on the instance vertex v.

In a variation on this embodiment, the system selects the set of edges by selecting an edge with the lowest rank.

In a variation on this embodiment, the system determines a feasible cell placement by reassigning cell: instances to regions. Each edge in the selected set of edges is incident on an instance vertex and a region vertex. The system reassigns the cell instance associated with the instance vertex to the region associated with the region vertex.

DETAILED DESCRIPTION

Figure 1:
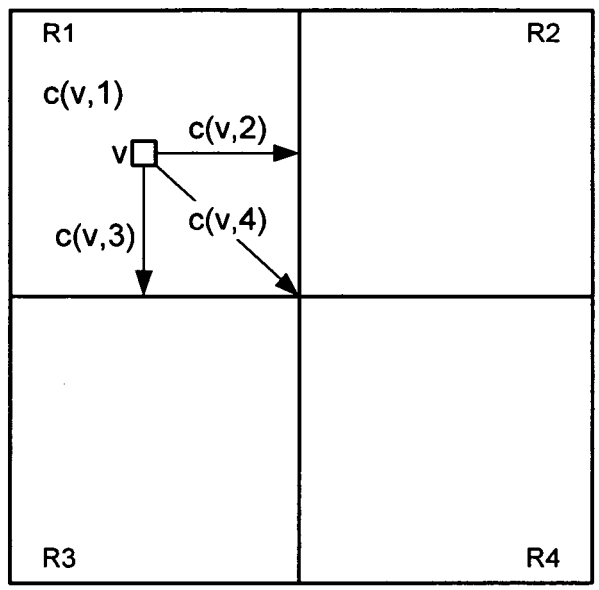
FIG. 1 illustrates how movement costs can be assigned to a cell in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Cell Placement

Recall that quadratic placement is one of the effective techniques for doing top-down partitioning-based placement. The quadratic formulation results in a convex problem, which can be solved efficiently using sparse linear solvers. However, in practice, the solution from the quadratic solver rarely meets the capacity constraints in various sections of the chip. Instead, the concentration of objects in some areas of the chip is extremely high, while the concentration of objects in other areas is extremely low.

Various techniques have been proposed to remedy this problem. Some approaches use "attractive" and "repellent" forces to draw objects from high concentration areas towards areas of low concentration, thereby balancing the distribution of objects across the chip. Other approaches adjust the concentration of the movable objects by applying a partitioning on the result of the quadratic solution. One such approach argues that the quadratic solver obtains a good solution, which needs to be adjusted as little as possible to minimize the overlap and to make sure that the capacity constraints of the partitions are met. Further details of this approach (hereinafter "Vygen") can be found in J. Vygen, "Algorithms for Large-Scale Flat Placement," Proceedings of Design Automation Conference, pp. 746-751, 1997. Note that Vygen's approach is unlike the approaches that use min-cut partitioning to adjust the cell placement. In Vygen's approach, the cell reassignment step minimizes the total movement of the cells required to satisfy the capacity constraints.

Since minimizing the total movement is an NP-hard problem, Vygen's approach relaxes the problem so that a cell may be assigned partially to the four quadrants, and as a result may be broken into up to four pieces. It can be shown that the optimal solution to the relaxed version of the problem will have at most three instances that are broken and hence partially assigned to more than one partition. All other cell instances will be completely assigned to one and only one partition. Unfortunately, Vygen's technique to determine a solution to the relaxed version of the problem is extremely complicated. Indeed, the proof of correctness is over 30 pages long.

Other approaches based on the relaxed assignment problem use min-cost flow (MCF) formulations. However, the time complexity of these techniques is typically $O(m^2 \cdot \log(n))$, where n and m are the number of vertices and the number of edges in the MCP formulation, respectively. Hence, these prior art techniques can take a long time to find a solution if the number of edges (m) is large.

Minimum-Movement Cell Assignment Problem

Let $D=(G, R)$ represent a design where $G=(V, E)$ is a hypergraph representing the netlist (in which V represents the set of vertices—also referred to as cells, instances, or placeable objects—and E represents the hyperedges, wherein each hyperedge is a set of vertices that are connected by a net in the netlist), and R is the rectangular region defining the boundary of the chip or placement area for the netlist. The first step in each level of the recursive top-down quadratic placement is to find x, y locations for each of the vertices in V. Then, the placeable area for this level of placement is typically divided into 2 (bi-partitioning) or 4 (quadri-section) partitions. One embodiment of the present invention uses the quadri-section approach, whereas another embodiment of the present invention uses the bi-partitioning approach.

In one embodiment, the quadratic solver solution is disturbed as little as possible to meet the capacity constraints on the four quadrants. This problem can be formulated as follows. Let $(x_i, y_i)$ represent the position obtained for the (anchor point of) vertex $v_i$ in the result obtained from the quadratic solver. In one embodiment, the placeable area can be divided into four by one horizontal line and one vertical line that divide the horizontal and vertical span of the area into two equal portions, resulting in four equally sized quadrants. Let $R_1$, $R_2$, $R_3$, and $R_4$ denote the four quadrants. Let the quantity $c(v_i, j)$ be the movement cost of assigning the vertex $v_i$ to quadrant $R_j$, which is set to shortest rectilinear distance from $(x_i, y_i)$ to $R_j$.

FIG. 1 illustrates how movement costs can be assigned to a cell in accordance with an embodiment of the present invention.

The quadratic solver has placed cell v inside quadrant R1, resulting in $c(v, 1)=0$. The costs $c(v, 2)$, $c(v, 3)$, $c(v, 4)$ are the minimum rectilinear distances that cell v has to move to get to quadrants R2, R3, and R4, respectively.

Associated with each of the quadrants $R_j$, there is a quantity $K_j$, denoting the capacity available in this quadrant, and associated with each vertex $v_i$, there is a quantity $size(v_i)$ denoting the area occupied by the vertex $v_i$. An assignment of vertices in V to the quadrants is called feasible if and only if for all quadrants, the total size of all vertices assigned to each quadrant does not exceed the capacity of this quadrant. Formally, let the function $f: V \rightarrow \{1, 2, 3, 4\}$ represent the assignment, wherein $v_i$ is assigned to quadrant $R_j$ if $f(v_i)=j$. The assignment defined by $f$ is feasible if and only if:

$$\Sigma\{size(v)|f(v)=i\} \leq K_i, \text{ for } i=1, 2, 3, 4. \quad (1)$$

The cost of such an assignment is the sum of the individual vertex assignments. Formally, $$cost(f) = \Sigma\{c(v_i, k)|f(v_i)=k\}. \quad (2)$$

Next, we formulate the capacity-constrained min-cost assignment problem using the above definitions.

Capacity-Constrained Min-Cost Assignment Problem (CCMAP)

A problem instance of CCMAP can be defined as a tuple (V, S, R, K, C), where $V=\{v_1, v_2, \ldots, v_n\}$ is the set of vertices, S is the set of sizes associated with these vertices, $R=\{R_1, R_2, R_3, R_4\}$ is the set of quadrants, $K=\{K_1, K_2, K_3, K_4\}$ are the capacities, where $K_i$ is the capacity of quadrant $R_i$, and $C=\{C_1, C_2, \ldots, C_n\}$ is the set of cost vectors, where $C_i=(c(v_i, 1), c(v_i, 2), c(v_i, 3), c(v_i, 4))$, where $c(v_i, j)$ is the cost of assigning vertex $v_i$ to quadrant $R_j$.

The objective function for a CCMAP instance is typically to determine a minimum-cost feasible assignment $f$ of vertices in V to the quadrants $R_1, R_2, R_3, R_4$, where the cost of the assignment is as defined in Equation (2).

Unfortunately, CCMAP is NP-hard, and as a result, solving a CCMAP instance can be impractical because it can take an extremely long time to determine the solution. However, a relaxed version of this problem is not NP-hard. In the relaxed version, the assignment of vertices to the quadrants can be a partial assignment. The relaxed version can be formulated as described below.

One embodiment of the present invention can find a solution to the relaxed capacity-constrained min-cost assignment problem without requiring a large amount of time. Specifically, the time complexity of one embodiment of the present invention is O(m·log(m)), where m is the number of edges.

Relaxed Capacity-Constrained Min-Cost Assignment Problem (R-CCMAP)

A problem instance of R-CCMAP is defined the same way as a problem instance of CCMAP. However, the objective function is different. The objective function for a R-CCMAP instance is typically to determine a fractional assignment $g: V \times \{1, 2, 3, 4\} \to [0,1]$ that satisfies the following constraints:

$$g(v,1)+g(v,2)+g(v,3)+g(v,4)=1, \text{ for all } v \in V \quad (3)$$

$$\sum_{v \in V} size(v) \times g(v, i) \leq K_i, \text{ for } i = 1, 2, 3, 4, \quad (4)$$

and minimizes the total movement cost:

$$\sum_{v \in V} \left\{ size(v) \times \sum_{i=1}^{4} (g(v, i) \times c(v, i)) \right\}. \quad (5)$$

One embodiment of the present invention solves the R-CCMAP problem by representing the problem using a bi-partite graph. There are two types of vertices in the bi-partite graph: |V| instance vertices $v_1, \ldots, v_{|V|}$, and 4 quadrant vertices $w_1, w_2, w_3, w_4$. Associated with each instance vertex $v_i$, we define an attribute $size(v_i)$, and associated with each quadrant vertex $w_j$, we define an attribute $capacity(w_j)$. There is an edge from instance vertex $v_i$ to quadrant vertex $w_j$, and associated with this edge, there exists a cost factor $cost(v_i, j)$.

Figure 2:
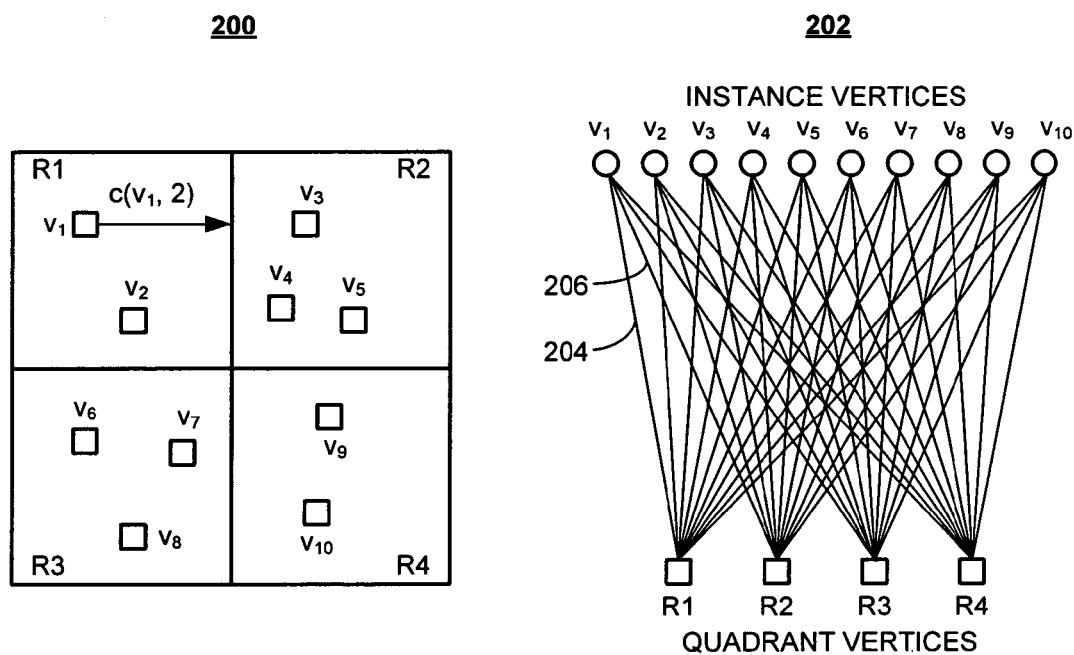
FIG. 2 illustrates a bi-partite graph representation of a R-CCMAP instance in accordance with an embodiment of the present invention.

FIG. 2 illustrates a bi-partite graph representation of a R-CCMAP instance in accordance with an embodiment of the present invention.

Bi-partite graph 202 is a graph representation of the R-CCMAP instance illustrated by cell placement 200. Cell placement 200 contains four regions (or quadrants), namely, R1, R2, R3, and R4. Cell placement 200 also contains ten cell instances, namely, $v_1, v_2, v_3, v_4, v_5, v_6, v_7, v_8, v_9$, and $v_{10}$. Note that each cell instance is assigned to a region. A solution to the R-CCMAP instance reassigns these ten cell instances to the four regions.

Bi-partite graph 202 contains two types of vertices: region vertices which are depicted by squares and instance vertices which are depicted by circles. As shown in bi-partite graph 202, the region vertices are associated with the four regions R1, R2, R3, and R4, and the instance vertices are associated with the cell instances $v_1, v_2, v_3, v_4, v_5, v_6, v_7, v_8, v_9$, and $v_{10}$.

Each edge couples (or is incident on) an instance vertex and a region vertex. For example, edge 204 is incident on instance vertex $v_1$ and region vertex R1, edge 206 is incident on instance vertex $v_1$ and region vertex R2, and so on. The cost associated with each edge indicates the cost of placing the associated cell instance in the associated region. For example, since cell instance $v_1$ is already in region R1 the cost of edge 204 is equal to zero. On the other hand, the cost of edge 206 is equal to $c(v_1, 2)$ which is the cost of placing cell instance $v_1$ in region R2. Cost $c(v_1, 2)$ is illustrated in cell placement 200.

A solution to an R-CCMAP instance is a partial assignment of the instance vertices to the quadrant vertices such that the capacity of the quadrant vertices is not violated, and the total cost of the assignment is minimized.

Before proceeding further, it will be helpful to introduce terminology that will be useful to understand how to solve the R-CCMAP instance using the graph representation. The edges incident on the same instance vertex are called source neighbors of one another, and the edges incident on the same quadrant vertex are called quadrant neighbors of one another. Edges have two states: alive or dead. The edge states indicate whether the edges are to be considered (alive edges) during the remainder of the solution process or whether they should be ignored (dead edges).

When the process begins, all the edges are marked as alive. An edge becomes dead when one of two things happen: either the instance vertex at its source end becomes completely assigned to one or more quadrants, or the available capacity of the quadrant vertex at its target end has been exhausted, and there is no more room for any more assignment to this quadrant vertex. In other words, an edge is alive if the cell instance associated with the edge has not been assigned to a region, and the region associated with the edge is not full.

Let SN(e) and QN(e) denote the set of currently live source neighbors and currently live quadrant neighbors of an edge e, respectively. The shadow-edge of e at any moment in time, denoted as $e_S$, is defined as the member of SN(e) which satisfies the following two properties.

$$cost(e) \leq cost(e_S) \quad (6)$$

$$cost(e_S) \leq cost(f), \text{ for all edges } f \text{ in SN}(e) \quad (7)$$

If there is no shadow edge that satisfies the above two properties, then we indicate that situation using the notation: $e_S = \emptyset$. In other words, the shadow edge of an edge e is the next cheapest live edge out of the same source vertex, if one exists. The shadow-cost $cost_S(e)$ for an edge e is defined as follows:

$$cost_S(e) = cost(e_s); \quad \text{if } e_s \neq \emptyset \qquad (8)$$
$$= 0; \quad \text{if } e_s \neq \emptyset$$

Figure 3:
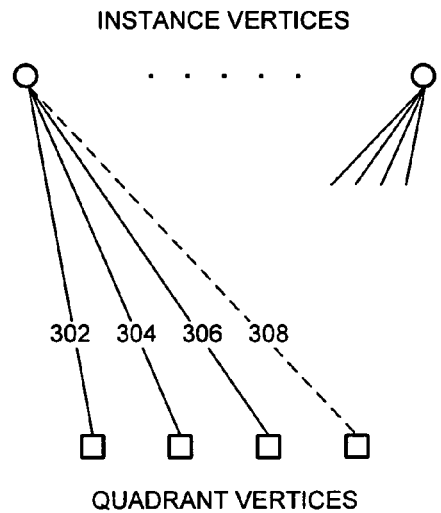
FIG. 3 illustrates how edges can be associated with shadow edges in accordance with an embodiment of the present invention.

FIG. 3 illustrates how edges can be associated with shadow edges in accordance with an embodiment of the present invention. (Note that only a section of the bipartite graph has been shown for the sake of clarity.)

Edges 302, 304, 306, and 308 are incident on the same instance vertex as shown in FIG. 3. Let the costs assigned to edges 302, 304, 306, and 308 be 6, 9, 12, and 4, respectively. Further, let us assume that edge 308 is dead, i.e., the region associated with edge 308 is full and cannot accept any more cell instances. Under these assumptions, edge 304 is the shadow edge for edge 302. This is because edge 304 is alive and has a cost of 9, and hence it is the next cheapest live edge when compared to edge 302. Similarly, edge 306 is the shadow edge for edge 304. However, edge 306 does not have any shadow edge because edge 306 has the highest cost, and hence there is no next cheapest edge. Finally, since edge 308 is dead, a shadow edge is not computed for it.

For each quadrant vertex v, the anchor-edge $e_{anchor}(v)$ is defined as the shadow edge of maximum cost associated with all the live edges incident with v, if one exists, or $\emptyset$ otherwise. Formally, the anchor-cost $cost_{anchor}(v)$ is defined as:

$$cost_{anchor}(v) = cost(e_{anchor}); \quad \text{if } e_{anchor}(v) \neq \emptyset \qquad (9)$$
$$= 0; \quad \text{if } e_{anchor}(v) \neq \emptyset$$

Further, for each live edge e=(v, w) from instance vertex v to quadrant vertex w, its rank rank(e) is defined as follows:

$$\text{rank}(e) = cost_{anchor}(v) + [cost(e) - cost_S(e)] \qquad (10)$$

Next, we describe a process for determining a feasible cell placement by solving the corresponding R-CCMAP instance.

Process for Determining a Feasible Cell Placement

Figure 4:
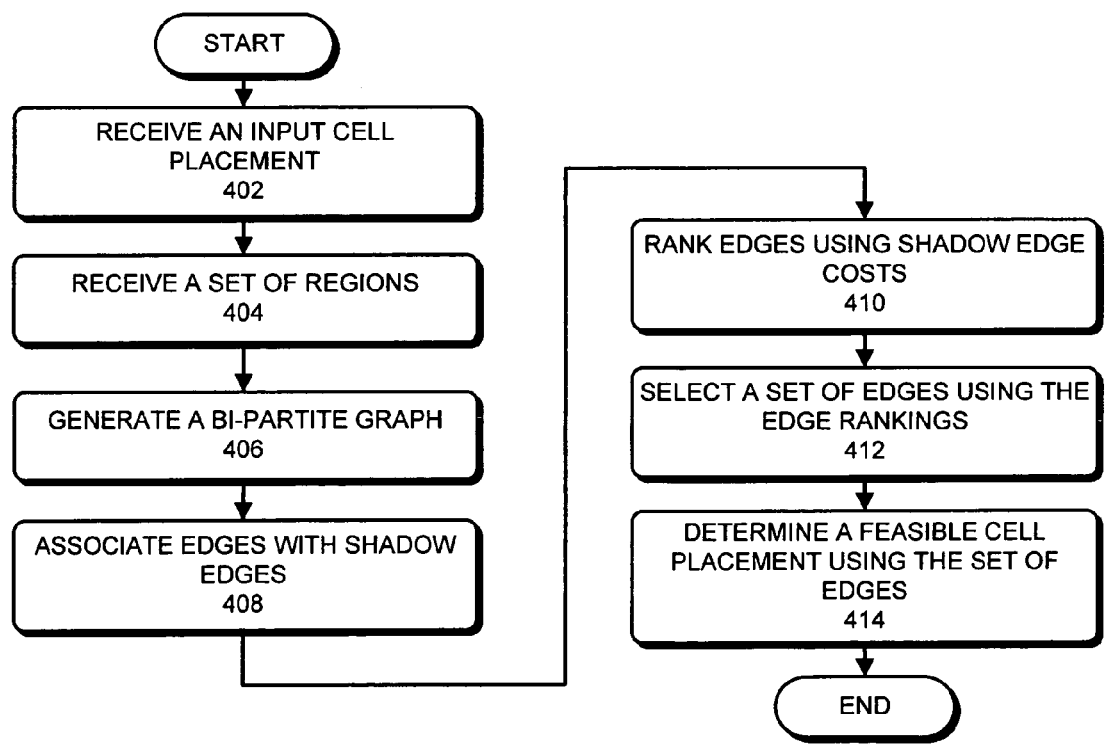
FIG. 4 presents a flowchart that illustrates a process for determining a feasible cell placement in accordance with an embodiment of the present invention.

FIG. 4 presents a flowchart that illustrates a process for determining a feasible cell placement in accordance with an embodiment of the present invention.

The process usually begins by receiving an input cell placement, which assigns a position to each cell instance in the integrated circuit design (step 402).

In one embodiment, the input cell placement is generated by solving a quadratic formulation. More specifically, in one embodiment, the quadratic formulation minimizes the total wire-length. Note that the input cell placement is typically an infeasible cell placement that violates the capacity constraint of a region. The process uses this infeasible cell placement to determine a feasible cell placement which is a cell placement that satisfies the capacity constraints of all regions.

Next, the system receives a set of regions within the integrated circuit design, wherein each region has a capacity constraint which typically specifies an upper limit on the total cell area that can be placed within the region (step 404).

Each cell instance is associated with a size, which usually indicates the area of the cell instance.

The system then generates a bi-partite graph which comprises instance vertices, region vertices, and edges (step 406).

An instance vertex is associated with a cell instance, a region vertex is associated with a region, and each edge is incident on an instance vertex and a region vertex. Each edge is assigned a cost that indicates the cost of placing the associated cell instance in the associated region.

Next, the system associates edges with shadow edges as described above (step 408).

Recall that an edge and an associated shadow edge are incident to the same instance vertex. In one embodiment, the shadow edge is identified using Equations (6) and (7).

The system then ranks the edges using the costs of the shadow edges (step 410).

In one embodiment, the rank of an edge is computed using Equation (10).

Next, the system selects a set of edges using the edge rankings (step 412).

In one embodiment, the system uses a greedy approach that uses the edge ranks to select the next edge to process. Specifically, selecting the set of edges involves selecting an edge with the lowest rank.

Associated with each instance vertex v, we have a quantity called unassignedSize(v), which is initially set to size(v), and associated with each quadrant (or region) vertex w, we define a quantity called availableCapacity(w), which is initialized to capacity(w). As the process makes (partial) assignments, the unassignedSize(v) and availableCapacity (w) of the instance and quadrant vertices are updated to reflect the assignments made so far, and to reflect the resource needs and availabilities for future assignments.

At the beginning of the selection process, the ranks for all the edges are computed, and the edge ranks are used as a key in a minimum heap that contains all the candidate edges. Next, the selection process goes through the edges one at a time. At each step, the process extracts the live edge with the minimum rank, and processes it.

The processing of an edge involves assigning as much capacity as possible of the remaining (unassigned) size of the instance vertex at the source of the edge being picked, to the target (quadrant or region) vertex. Let v, w represent the instance vertex and the quadrant (or region) vertex, respectively, incident to the edge e=(v, w) which was selected by the process. There are two possibilities:

(a) unassignedSize(v) ≦ availableCapacity(w), and
(b) unassignedSize(v) > availableCapacity(w).

In case (a), the process assigns the remaining unassigned portion of v to w (i.e., pushes a quantity equal to unassignedSize(v) through the edge e from v to w), sets unassignedSize(v)=0, and updates availableCapacity(w) to reflect this assignment. Also, since the vertex v is fully assigned at this point, all its incident edges are marked as dead, and can be safely removed from the heap as they not useful to the process any more.

In case (b), the process assigns as much capacity available in w to v, through the edge e. Note that this exhausts the available capacity in w, resulting in availableCapacity(w)=0, and requires an update to unassignedSize(v) to reflect the assignment just made. Also, all live edges incident to this target vertex w are marked as dead because the target quadrant is full and cannot accommodate any more cell assignments.

Each partial or complete assignment that occurs during the course of the process is of the form of (e, area), where e is the edge that is used for the (partial) assignment, and area is the amount of capacity associated with this assignment.

In either of the two cases, after changing the status of the live edges that were marked as dead, the process updates the ranks of the remaining live edges, ensuring that the min-heap is maintained in the sorted order, with all the entries associated with the dead edges removed.

Continuing with the flowchart in FIG. 4, the system then determines a feasible cell placement using the set of edges (step 414).

Recall that each edge determines a placement for a cell in a region. Hence, the set of edges determines a cell placement for all cell instances. Further, note that this cell placement satisfies all regional capacity constraints.

The assignment solution returned by the process results in at most 3 partial assignments of the instance vertices to the quadrant vertices. These partial assignments can be changed so that they are assigned completely to one of the regions. If, for some reason, these partial assignments cannot be converted into complete assignments, the process can return an error indicating that the process was unable to determine a feasible cell assignment.

To understand why the selection process results in at most three partial assignments, one needs to look at the events under which a partial assignment occurs. There is only one event in which a partial assignment occurs: when a region becomes full. When a cell is being assigned to a region, and the region becomes full, a part of the cell is assigned to another region. Since there are only four regions, there can only be three "region full" events during the edge selection process. Hence, there can only be three partial assignments.

Further, note that one embodiment of the present invention takes $O(m \cdot \log(m))$ time to determine a feasible cell placement, where m is the number of edges.

The system can maintain a separate min-heap for the edges competing for each partition (or region). The number of edges competing for each partition (or region) is n, the number of vertices. The key value for an edge e is given by $key(e) = cost(e) - cost_S(e)$. Also, for the heap associated with partition (or region) i, we maintain (and update as necessary) the partition's anchor cost: $cost_{anchor}(i)$. Note that we can compute the rank(e) for an edge e by adding its key value, key(e), to the target partition's anchor cost, and that among all edges competing for the same partition, the one with smallest (largest) key has the smallest (largest) rank. Therefore, if we find the winner in each partition, we can find the ultimate winner among all the individual partition winners also, using O(m) additional work. Note that determining the winning edge in each partition takes at most $O(\log n)$ time.

Now, to prove that the total run-time of the process is bounded above by $O(n \cdot \log n)$, we need to show two things. First, that the total number of times we extract the minimum element in the heaps is bounded by O(n). This is rather obvious as each time we find a winner, this will result in at least one more dead edge. Therefore, the total number of times we need to find a new winner edge is O(n). Second, we need to show that the total time we spend on updating the heaps or their anchor costs due to changes that are made is bounded above by $O(n \log n)$. This can be shown by observing that the key value of an edge changes only when its shadow edge changes. Now, the number of times that this can happen to an edge is O(m), where m is the number of partitions, which is constant and equal to 4 in our problem.

Also, we need to ensure that the total time we spend on updating a partition's anchor cost is bounded above by $O(n \log n)$. Observe that the anchor edge for a partition can at most change O(n) times, and we can maintain a heap of all the candidate edges that could serve as an anchor for each partition. Hence, the time complexity to update the anchor edge for all partitions remains bounded by $O(m \cdot n \cdot \log n)$.

To summarize, rather than maintaining one single heap, we maintain 4 heaps, one for each partition. And rather than maintaining the key(e) to be equal to rank(e), we observe that all the edges competing for the same partition share the same anchor cost, and therefore, we can factor this part out to minimize the need to update all the keys in a heap every time the anchor changes. Rather, we only update the anchor cost of the partition, spending at most $O(\log n)$ time, while keeping the heap intact. The combination of these observations, ensures that the total number of times the information updates take is bounded so that the total time complexity of the process remains bounded above by $O(m \cdot n \cdot \log n)$, where m is the number of regions, and n is the number of cell instances to be placed into m regions.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a feasible cell placement for an integrated circuit design, the method comprising:
   receiving an input cell placement, which assigns a position to each cell instance in the integrated circuit design;
   receiving a set of regions within the integrated circuit design, wherein each region has a capacity constraint which can specify an upper limit on the total cell area that can be placed within the region;
   generating a bipartite graph which comprises instance vertices, region vertices, and edges, wherein an instance vertex is associated with a cell instance, a region vertex is associated with a region, and each edge is incident on an instance vertex and a region vertex, wherein each edge is assigned a cost that indicates the cost of placing the associated cell instance in the associated region;
   associating edges with shadow edges, wherein an edge and an associated shadow edge are incident to the same instance vertex;
   ranking the edges using the costs of the shadow edges;
   selecting a set of edges using the edge rankings; and
   determining the feasible cell placement using the set of edges,
   wherein ranking the edges involves assigning a rank r(e) to edge e using the expression $r(e) = \text{cost anchor}(v) + [cost(e) - cost_S(e)]$;
   wherein cost(e) is the cost of the edge e, $cost_S(e)$ is the cost of the shadow edge associated with the edge e, and cost anchor (v) is the cost of the anchor edge associated with the instance vertex v;
   wherein the edge e is incident on the instance vertex v; and
   wherein the anchor edge is the costliest shadow edge out of all the shadow edges associated with the live edges which are incident on instance vertex v.

2. The method of claim 1,
wherein the input cell placement is determined using a quadratic placement technique;
wherein the input cell placement is a cell placement that violates the capacity constraint of a region;
wherein the feasible cell placement is a cell placement that satisfies the capacity constraints of all regions.

3. The method of claim 1,
wherein a first edge is incident on a first instance vertex;
wherein the first edge is alive if the first cell instance associated with the first instance vertex has not been assigned to a first region; and
wherein the first shadow edge associated with the first edge is the next cheapest live edge incident on the first instance vertex.

4. The method of claim 1, wherein selecting the set of edges involves selecting an edge with the lowest rank.

5. The method of claim 1,
wherein determining the feasible cell placement involves placing a second cell instance in a second region;
wherein the second cell instance is associated with a second instance vertex;
wherein the second region is associated with a second region vertex; and
wherein a second edge in the set of edges is incident on the second incident vertex and the second region vertex.

6. The method of claim 1, wherein the set of regions can include two rectangular regions, or four rectangular regions.

7. A computer-readable storage medium storing instructions that when executed by a computer cause the computer to perform a method for determining a feasible cell placement for an integrated circuit design, the method comprising:
receiving an input cell placement, which assigns a position to each cell instance in the integrated circuit design;
receiving a set of regions within the integrated circuit design, wherein each region has a capacity constraint which can specify an upper limit on the total cell area that can be placed within the region;
generating a bi-partite graph which comprises instance vertices, region vertices, and edges, wherein an instance vertex is associated with a cell instance, a region vertex is associated with a region, and each edge is incident on an instance vertex and a region vertex, wherein each edge is assigned a cost that indicates the cost of placing the associated cell instance in the associated region;
associating edges with shadow edges, wherein an edge and an associated shadow edge are incident to the same instance vertex;
ranking the edges using the costs of the shadow edges;
selecting a set of edges using the edge rankings; and
determining the feasible cell placement using the set of edges,
wherein ranking the edges involves assigning a rank $r(e)$ to edge e using the expression $r(e)=\text{cost anchor }(v)+[\text{cost}(e)-\text{costs}(e)]$;
wherein $\text{cost}(e)$ is the cost of the edge e, $\text{costs}(e)$ is the cost of the shadow edge associated with the edge e, and cost anchor $(v)$ is the cost of the anchor edge associated with the instance vertex v;
wherein the edge e is incident on the instance vertex v; and
wherein the anchor edge is the costliest shadow edge out of all the shadow edges associated with the live edges which are incident on instance vertex v.

8. The computer-readable storage medium of claim 7,
wherein the input cell placement is determined using a quadratic placement technique;
wherein the input cell placement is a cell placement that violates the capacity constraint of a region;
wherein the feasible cell placement is a cell placement that satisfies the capacity constraints of all regions.

9. The computer-readable storage medium of claim 7,
wherein a first edge is incident on a first instance vertex;
wherein the first edge is alive if the first cell instance associated with the first instance vertex has not been assigned to a first region; and
wherein the first shadow edge associated with the first edge is the next cheapest live edge incident on the first instance vertex.

10. The computer-readable storage medium of claim 7, wherein selecting the set of edges involves selecting an edge with the lowest rank.

11. The computer-readable storage medium of claim 7,
wherein determining the feasible cell placement involves placing a second cell instance in a second region;
wherein the second cell instance is associated with a second instance vertex;
wherein the second region is associated with a second region vertex; and
wherein a second edge in the set of edges is incident on the second incident vertex and the second region vertex.

12. The computer-readable storage medium of claim 1, wherein the set of regions can include two rectangular regions, or four rectangular regions.

13. An apparatus for determining a feasible cell placement for an integrated circuit design, the apparatus comprising:
a first receiving mechanism configured to receive an input cell placement, which assigns a position to each cell instance in the integrated circuit design;
a second receiving mechanism configured to receive a set of regions within the integrated circuit design, wherein each region has a capacity constraint which can specify an upper limit on the total cell area that can be placed within the region;
a generating mechanism configured to generate a bi-partite graph which comprises instance vertices, region vertices, and edges, wherein an instance vertex is associated with a cell instance, a region vertex is associated with a region, and each edge is incident on an instance vertex and a region vertex, wherein each edge is assigned a cost that indicates the cost of placing the associated cell instance in the associated region;
an associating mechanism configured to associate edges with shadow edges, wherein an edge and an associated shadow edge are incident to the same instance vertex;
a ranking mechanism configured to rank the edges using the costs of the shadow edges;
a selecting mechanism configured to select a set of edges using the edge rankings; and
a determining mechanism configured to determine the feasible cell placement using the set of edges,
wherein ranking the edges involves assigning a rank $r(e)$ to edge e using the expression $r(e)=\text{cost anchor }(v)+[\text{cost}(e)-\text{costs}(e)]$;

wherein cost(e) is the cost of the edge e, costs(e) is the cost of the shadow edge associated with the edge e, and cost anchor (v) is the cost of the anchor edge associated with the instance vertex v;

wherein the edge e is incident on the instance vertex v; and wherein the anchor edge is the costliest shadow edge out of all the shadow edges associated with the live edges which are incident on instance vertex v.

14. The apparatus of claim 13, wherein the input cell placement is determined using a quadratic placement technique;

wherein the input cell placement is a cell placement that violates the capacity constraint of a region;

wherein the feasible cell placement is a cell placement that satisfies the capacity constraints of all regions.

15. The apparatus of claim 13, wherein a first edge is incident on a first instance vertex;

wherein the first edge is alive if the first cell instance associated with the first instance vertex has not been assigned to a first region; and wherein the first shadow edge associated with the first edge is the next cheapest live edge incident on the first instance vertex.

16. The apparatus of claim 13, wherein the selecting mechanism is configured to select an edge with the lowest rank.

17. The apparatus of claim 13, wherein the determining mechanism is configured to place a second cell instance in a second region;

wherein the second cell instance is associated with a second instance vertex;

wherein the second region is associated with a second region vertex; and wherein a second edge in the set of edges is incident on the second incident vertex and the second region vertex.

18. The apparatus of claim 13, wherein the set of regions can include two rectangular regions, or four rectangular regions.

* * * * *